United States Patent [19]

Freehauf et al.

[11] 4,033,656

[45] July 5, 1977

[54] LOW PROFILE INTEGRATED CIRCUIT SOCKET

[75] Inventors: Eugene G. Freehauf, Ontario; Gene C. Hollingsworth, Cerritos; David Edward Welsh, Fullerton, all of Calif.

[73] Assignee: Zero Manufacturing Company, Burbank, Calif.

[22] Filed: Sept. 2, 1975

[21] Appl. No.: 609,702

[52] U.S. Cl. .................. 339/17 CF; 339/176 MP; 339/259 R
[51] Int. Cl.² .......................................... H05K 1/16
[58] Field of Search ...... 339/17 CF, 176 R, 176 M, 339/176 MP, 258 R, 258 F, 258 P, 259 R, 259 F

[56] References Cited

UNITED STATES PATENTS

| 3,212,047 | 10/1965 | McDonough | 339/17 CF |
| 3,274,532 | 9/1966 | Engel | 339/176 MP |
| 3,601,775 | 8/1971 | Longenecker | 339/258 P |
| 3,602,874 | 8/1971 | Sarazen | 339/17 CF |
| 3,732,529 | 5/1973 | Weisenburger | 339/17 CF |
| 3,831,131 | 8/1974 | Woodcock | 339/17 CF |
| 3,907,394 | 9/1975 | Barnes | 339/17 CF |

FOREIGN PATENTS OR APPLICATIONS

| 1,902,431 | 8/1970 | Germany | 339/17 CF |
| 608,333 | 9/1960 | Italy | 339/176 MP |

Primary Examiner—Roy Lake
Assistant Examiner—Mark S. Bicks
Attorney, Agent, or Firm—Edward J. DaRin

[57] ABSTRACT

An integrated circuit package socket of a "low profile" construction having a built-in anti-wicking feature and arranged to accept leads of varying widths without overstressing.

22 Claims, 12 Drawing Figures

U.S. Patent  July 5, 1977  Sheet 1 of 3  4,033,656
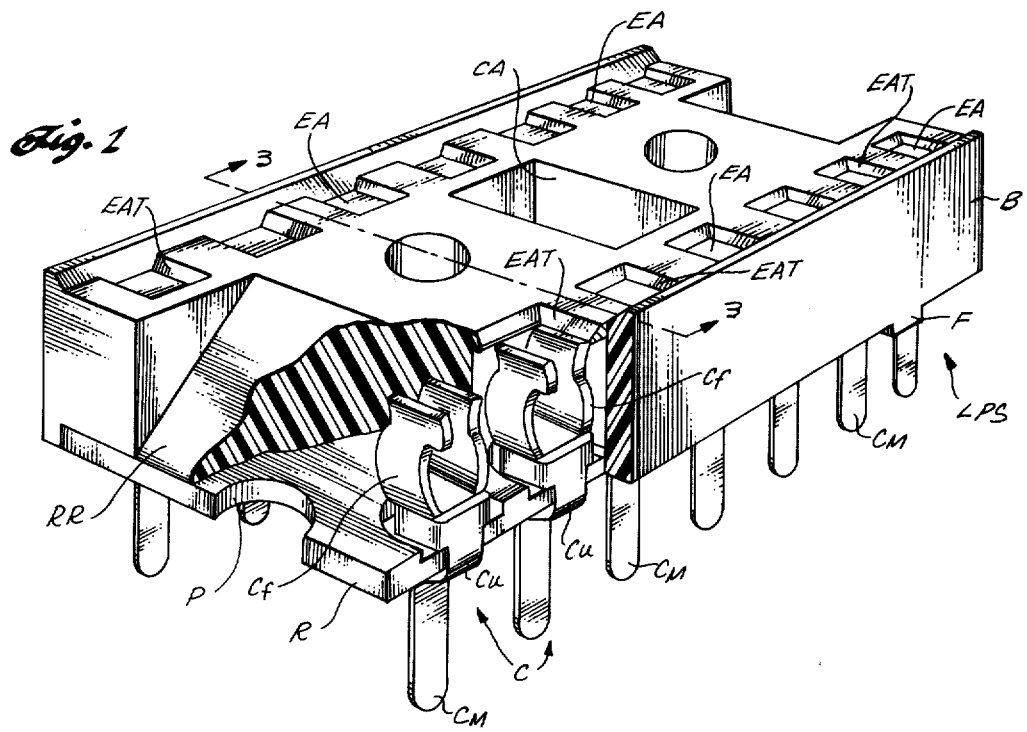
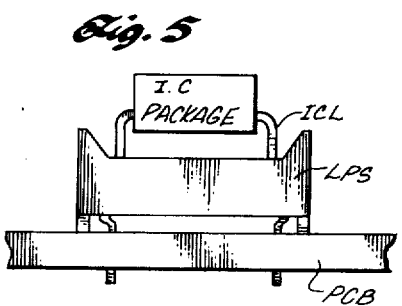
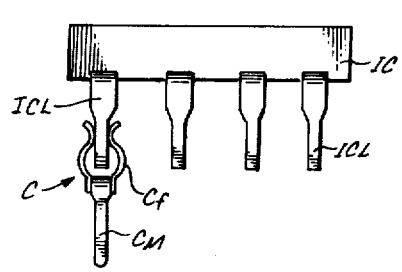
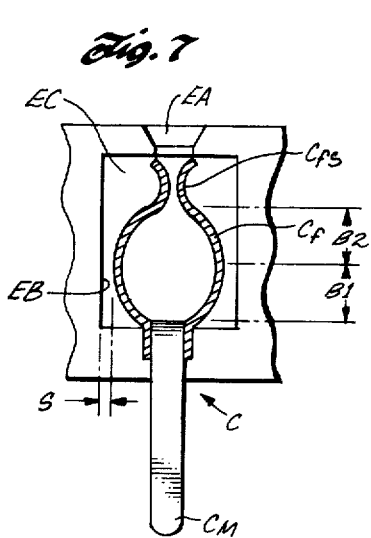
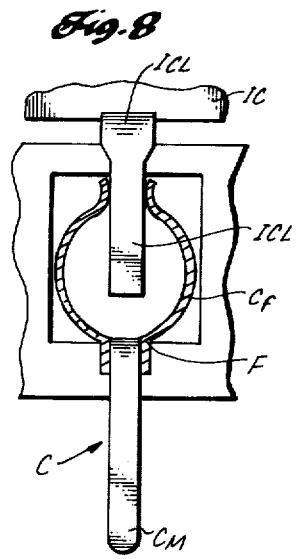
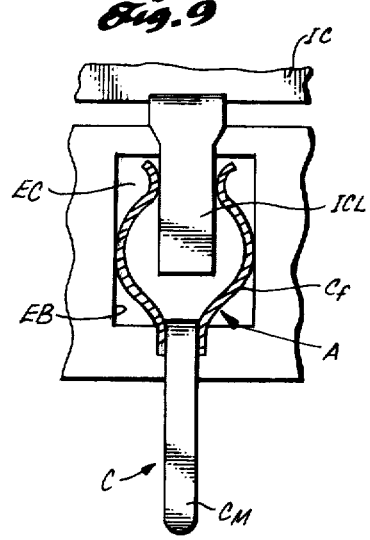

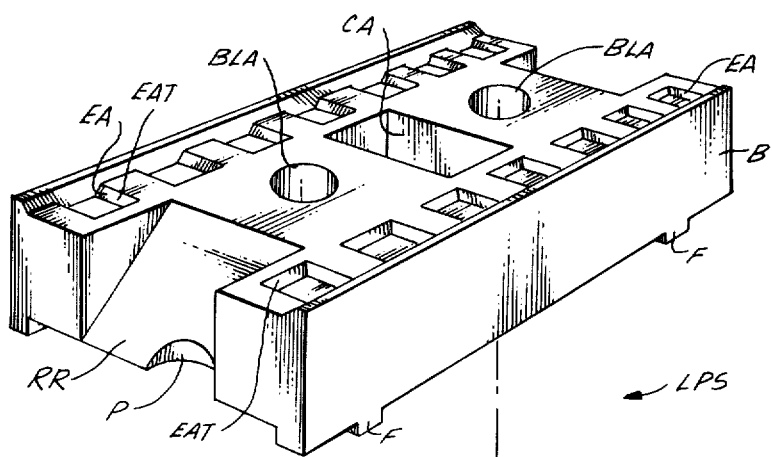
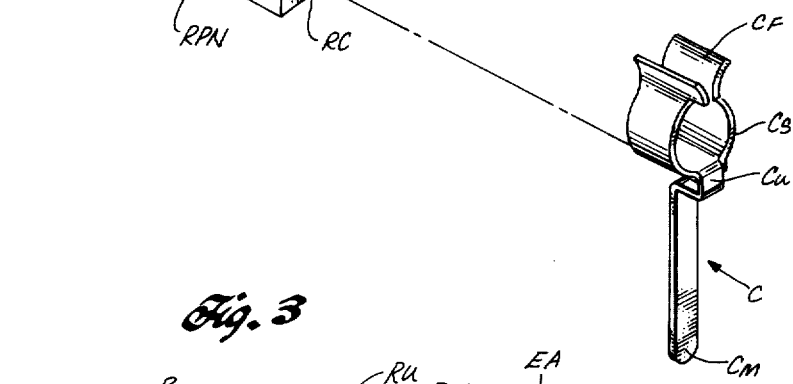
Fig. 2
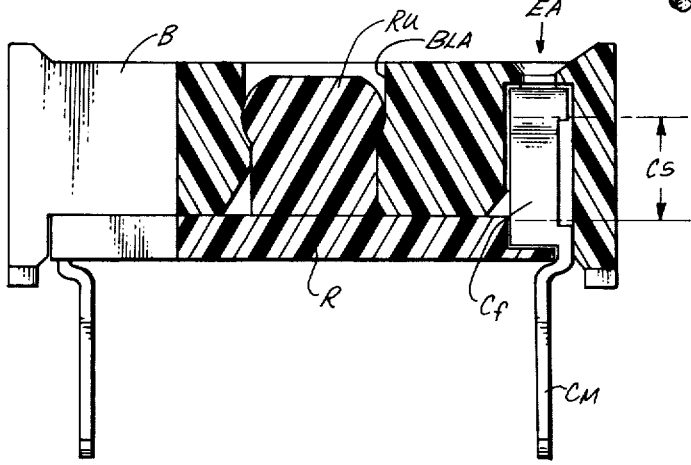
Fig. 3

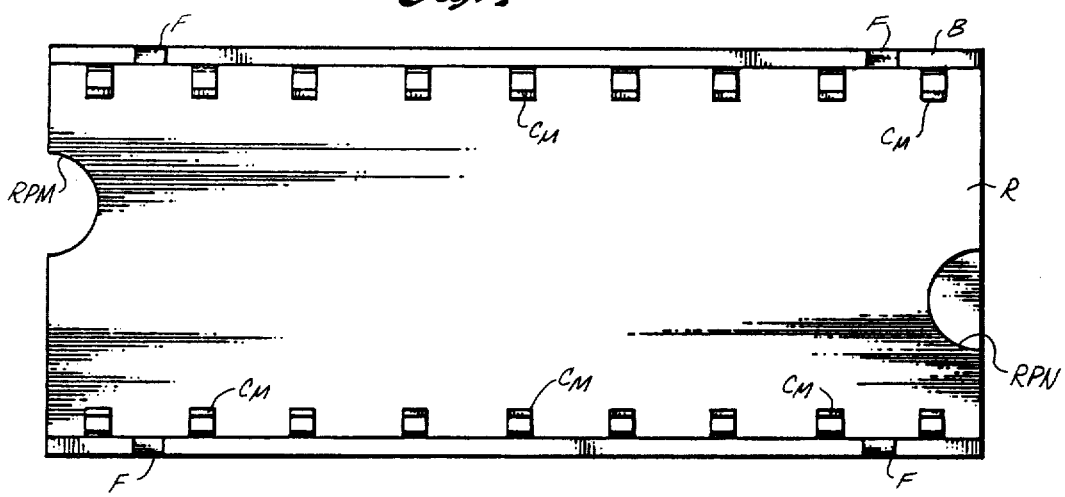
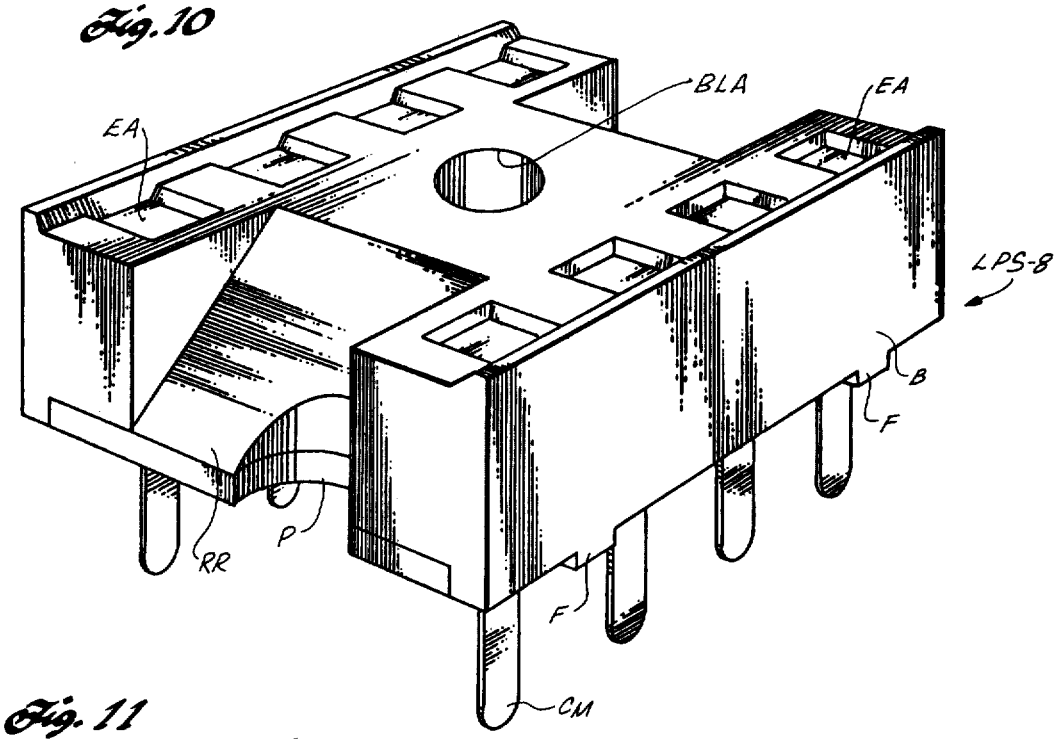
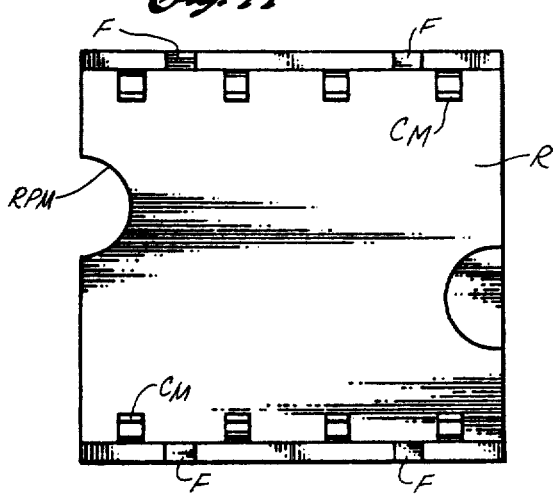
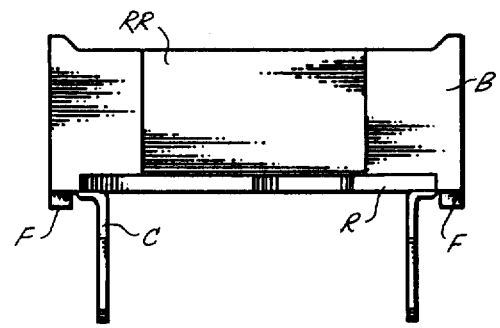

LOW PROFILE INTEGRATED CIRCUIT SOCKET

SUMMARY OF THE INVENTION

At the present time, there are commercially available sockets for mounting integrated circuit packages. The sockets for mounting integrated circuit packages are generally employed by mounting the sockets to a printed circuit board and utilizing the male terminal from the sockets for connecting the associated electrical circuits to the integrated circuits within the package. In order to increase the number of integrated circuit packages that may be mounted into a printed circuit system, sockets having a reduced height from the conventional sockets have been developed and are known in the art as "low profile" integrated circuit sockets. A low profile socket has a seating plane height extending above its mounting surface or printed circuit board on the order of 0.150 to 0.160 inch. These low profile sockets are designed so that they can be mounted end-to-end and/or side-by-side across the entire printed circuit board and allow the sockets to be mounted by automatic machinery. A low profile socket permits stacking of printed circuit boards mounting the sockets closer wherein the male terminal of the socket is generally employed as a solderable terminal and also allows closer mounting of the integrated circuit packages to the surface of the printed circuit board. Such low profile integrated circuit sockets are presently commercially available.

One of the problem areas with some available low profile sockets is that the contacts employed in the sockets for making electrical connections to the integrated circuits within a package are bottom loaded into an insulative carrier so as to expose a relatively large contact conductive area. The same low profile socket may not have wide stance mounting feet to prevent the socket from tilting when assembled and when the male termination is soldered to a printed circuit board and this tilt condition could cause solder bridging between the exposed bottom loaded contact and an adjacent printed circuit board trace resulting in shorting which ultimately causes a like condition to the inserted integrated circuit. This soldering procedure may be a wave solder assembly process and it has been found that in some present day sockets there is insufficient clearance between the top surfaces of the printed circuit board and the bottom surface of the socket for properly removing the solder flux to avoid contamination. Low profile sockets with aforementioned construction are subject to another problem inasmuch as during soldering the solder has no restrictive element to prevent it from traveling up the male portion of the contact into the contact spring area. This condition is commonly called "wicking". This condition causes the spring contact area to be contaminated with solder and/or fluxes and may cause the spring contact to improperly function. In addition, it has been found that some of the low profile sockets presently available are not capable of accepting the full range of integrated circuit leads without overstressing the contact leaves. Accordingly, there is a present need for an improved reliable low profile integrated circuit package socket that is inexpensive to manufacture and eliminates the aforementioned problems of the prior art types of low profile sockets including the above problems resulting from the solder assembly process.

The present invention provides an improved and relatively inexpensive integrated circuit package socket that has a built-in "anti-shorting and anti-wicking" feature and is provided with mounting feet having a wide stance to assure easy flux removal and proper installation on a mounting surface such as a printed circuit board in a stable relationship. The socket includes an improved contact leaf design that will accept a full range of integrated circuit package leads without overstressing. To this end, the contact is designed so as to coact with the body of the socket to provide a dual spring action when relatively large integrated circuit leads are inserted therein which prevents the contact leaves from becoming overstressed. The socket includes tapered entry aperatures for guiding the integrated circuit leads into a gripping relationship with the socket contacts in an edge wipe contact for providing a good electrical current conduction between the integrated circuit package lead and the socket contact. The socket contact is mounted on a base or retainer having a contact socket that allows it to be mounted and clamped thereto in a side loading operation and in a stable non-tilting fashion during assembly so as to provide the built-in anti-wicking and anti-shorting structure thereby eliminating the wicking and shorting problems of the prior art type sockets. To this same end, the socket includes mounting feet or standoffs of sufficient height and width for providing easy flux removal, proper installation and a stable assembly on a printed circuit board.

From a structural standpoint, the present invention provides an improved low profile integrated circuit package socket having an insulative body with a plurality of spaced apart electrical contact entry apertures extending therethrough. The entry apertures are arranged adjacent opposite edges of the body for receiving the leads of an integrated circuit package with the package leads extending into the entry apertures for electrical contact with the socket contacts mounted therein. A planar, insulative base or retainer member has a plurality of spaced apart individual electrical contact mounting positions arranged adjacent the opposite edges of the member for clampingly receiving the electrical contacts for the socket. The contacts are mounted in axial alignment with the lead receiving apertures for securing the leads of the integrated circuit package that are inserted between the leaves of the socket contacts. Each of the electrical contacts are defined with a female receptacle at one end in terms of the contact leaves for receiving the integrated circuit package leads, a formed clamping section and a male terminal portion extended therefrom to provide a solderable terminal to the socket. The base member mounting the thus defined electrical contacts are secured to the insulative body so that the male terminal portion of the socket contacts extend outwardly from the secured assembly of the socket body member and insulative body to allow an electrical connection to be made to the male terminal. The insulative body includes an integrated circuit package removal ramp for fast and easy removal of the integrated circuit package with a single tool and also includes a machine oriented polarization notch for easy assembly of the socket to a printed circuit board.

These and other features of the present invention may be more fully appreciated when considered in the light of the following specification and drawings, in which:

FIG. 1 is a perspective view, with portions broken away and shown in section, to illustrate the arrangement of the contacts within the socket and embodying the present invention;

FIG. 2 is an exploded view of the socket illustrated in FIG. 1;

FIG. 3 is a sectional view taken along the line 3—3 of FIG. 1;

FIG. 4 is a bottom plan view of the socket of FIG. 1;

FIG. 5 is a diagrammatic illustration of the socket of FIG. 1 mounted on a printed circuit board;

FIG. 6 is a diagrammatic representation of an integrated circuit package arranged in an edge wipe contact relationship with a detached socket contact;

FIG. 7 is a diagrammatic representation of the mounting of the electrical contact of the socket of the present invention and illustrated in its relaxed position prior to the insertion therein of an integrated circuit lead;

FIG. 8 is a diagrammatic representation of the socket contact arrangement of FIG. 7 with an integrated circuit package lead of nominal width inserted into the contact;

FIG. 9 is a diagrammatic representation of the socket contact arrangement of FIG. 7 illustrating the fully expanded condition of the contact with an integrated circuit lead of maximum tolerance inserted therein;

FIG. 10 is a perspective view of another embodiment of an integrated circuit package socket and embodying the present invention;

FIG. 11 is a bottom plan view of the socket of FIG. 10; and

FIG. 12 is a back end view of the socket illustrated in FIG. 10.

Now referring to the drawings, the integrated circuit package socket LPS of the present invention will be examined in detail. Generally, the socket LPS is constructed and defined of three basic elements and comprises a socket body B, an electrical contact C adapted to be mounted on a base or retainer member R and which are assembled together into a unitary structure; see FIG. 1. The socket LPS illustrated in FIGS. 1 and 2 is a 14-pin socket, i.e., it will accept an integrated circuit package having seven lead wires extending from opposite longitudinal sides thereof. It should be understood that the socket LPS illustrated in FIGS. 1 and 2 may be modified to include any number of pins that are normally employed in present day integrated circuit package designs such as 16, 18, 22, 24, 28, 36 and 40 pin sockets. FIG. 10 illustrates an 8-pin embodiment of the socket LPS and will be described more fully hereinafter.

The socket LPS is assembled into a unitary structure as a result of a provision of the pair of spaced upstanding elements RU mounted substantially centrally of the retainer or base member R for snap-locking it and the contacts C mounted thereon to the pair of locking apertures BLA provided for the socket body B to receive and secure the upstanding locking elements RU in a snap-locked relationship. The electrical contact C for the socket LPS has a conventional female socket $C_f$ for receiving an integrated circuit package lead or a similar leads and a male terminal $C_m$ extended therefrom in an offset relationship. The contact C is constructed and designed immediately adjacent the bottom end of the female contact $C_f$ with a U-shaped configuration Cu to allow it to be clamped in a secure relationship with the retainer R. For this purpose, the retainer R has a plurality of spaced apart contact receiving sockets RC defined thereon along the opposite longitudinal edges for receiving an individual contact C at the mounting socket RC, as illustrated in FIGS. 1 and 2. When the retainer R carrying the contacts C mounted thereon is snapped to the body member B, the contact C will be arranged in axial alignment with the entry apertures EA provided along the opposite longitudinal edges of the socket body B for receiving the integrated circuit package leads. The entry apertures EA of the body B extend completely through the body B for accepting the female socket portion $C_f$ of the contact C. The entry apertures EA are preferably provided with a tapered entry portion EAT to facilitate the entry of the integrated circuit package leads into the female contact $C_f$ in the correct conductive relationship. The side walls of the entry aperture EA below the tapered section EAT are of a straight planar configuration; see FIG. 3.

The body B of the socket LPS is also constructed and defined with a pair of ramps RR arranged intermediate the two rows of entry apertures EA on opposite ends of the body B. The ramps RR on each end of the socket provide for fast and easy removal of the integrated circuit package with a single tool. In accordance with the present invention the ramp RR also includes a single machine oriented polarization notch P. The polarization notch P, as illustrated in FIGS. 1 and 2, are arranged adjacent the righthand end of the ramp RR. The base member R is provided with a similar notch RPN arranged to be conicdent with the notch P when assembled as best appreciated from examining FIG. 4.

In a low profile socket of the type of the present invention, it is desired to provide a seating plane height for an integrated circuit package of approximately 0.150 – 0.160 inch above the top surface of a printed circuit board. This low socket height is restrictive in that it curtails the effective spring length of the female spring contacts normally employed with the sockets. It is well known that the spring action afforded by the female portion of a contact C or the contact leaves $C_f$ must be sufficient to provide a sufficient contact force with an integrated circuit package lead ICL to insure proper electrical conductivity between the two. A typical arrangement of the socket LPS with a printed circuit board PCB having an integrated circuit package, I.C., mounted on the socket LPS is illustrated in FIG. 5. The low profile height of the socket of 0.150 inch is also illustrated with respect to the top of the printed circuit board PCB. The female spring contact is diagrammatically illustrated in FIG. 6. Basically, the contact relates to the orientation of the integrated circuit package lead so that the contact C grips the widest portion of the rectangular integrated circuit lead ICL as illustrated in FIG. 6 for most effective conductive action.

It is well known that the leads ICL for the integrated circuit package IC vary in width and thereby stress the leaves of the contact C in various degrees in accordance with the width of the lead ICL. The present invention provides an improved contact design coacting with the socket body B so that the female contact leaves $C_f$ are mounted in a preselected relationship with the planar side walls EB of the spring chamber EC to cause it to be effective for the IC leads ICL of varying width covering the entire range of widths presently employed and without overstressing the leaves $C_f$. To this end, the relaxed position of the female leaves $C_f$ of the contact C is illustrated in FIG. 7. State differently, the relationship of the contact C with the side walls EB of the spring chamber EC as illustrated in FIG. 7 is the normal configuration for the leaves $C_f$ when a lead ICL is not mounted therein. To this end, the leaves $C_f$ are mounted with a pocket area or space between the outer bowed extremity of the leaves $C_f$ and the wall EB of the spring chamber EC and as illustrated in FIG. 7 is the space S. The space S is proportioned to the distance that the total spring beam for the contact spring $C_f$ is forced to deflect in the direction of the side walls EB of the spring chamber EC. The contact C can be considered to mount the spring leaves $C_f$ in a cantilevered relationship with respect to the male terminal portion $C_m$ when mounted to the base member R. The leaves $C_f$, as mounted and illustrated in FIG. 7, may be considered as defining two beams. The beams are illustrated in FIG. 7 as the beams B1 and B2 between the bottom end of the leaves $C_f$ and the bottom end of the spring portion $C_{fs}$. The proportions of the two lengths for the beams B1 and B2 are equated in accordance with the thickness of the physical properties of the contact material selected for the contact C.

When an integrated circuit package having leads of a nominal width is inserted into a contact C, the beam members function as a single unit rather than as a double beam. This arrangement is illustrated in FIG. 8 wherein a lead ICL of nominal width is shown inserted into the contact C and is still spaced from the adjacent side walls. In this relationship the contact spring section $C_{fs}$ causes the leaves $C_f$ to spread apart so that the contact $C_f$ functions about a fulcrum F adjacent the bottom end of the leaves $C_f$ at the bottom wall of the spring chamber EC as illustrated. In this arrangement, constant and equal spring forces are generated by the insertion of the ICL lead and are transmitted thereto for providing the proper electrical contact with the lead.

An important feature of the present invention is the provision of the dual beam action that prevents the contact C from becoming overstressed in response to the insertion of a lead ICL of maximum tolerance and is illustrated in FIG. 9. When such a lead is inserted into the socket and forces the leaves $C_f$ to spread apart the leaves $C_f$ each move into engagement with the side walls of the spring chamber EC, unlike the spaced relationship illustrated in FIGS. 7 and 8. The outer extremity of the bowed portions of the leaves $C_f$ move into engagement with the side walls of the spring chamber and are restricted from further movement beyond this point. As a result, a new fulcrum is defined at these points of contact and the second spring beam B2 becomes effective. This second spring beam B2 allows increased deflections of the leaves $C_f$ and through a kinetic effect a re-curve force is generated at that area A adjacent the bottom wall of the spring chamber EC; see FIG. 9. This re-curve force, see area A, reacts through the beam area B1 and assists the area B2 in applying repeatable contact force to the maximum tolerance integrated circuit package leads ICL. This also allows such contact forces to be repeatedly applied without overstressing leaves $C_f$, as in prior art products. The contact leaves of the present invention further amplifies the effectiveness of the dual spring action by the provision of a controlled beam cross section $C_n$ as illustrated in FIG. 3, to provide maximum response at the preselected fulcrum points.

It should be noted that the body B is provided with a plurality of mounting feet F or standoffs of sufficient width and height to assure easy flux removal, proper installation and a stable assembly. The feet F are constructed integral with the body B adjacent the corners thereof; see FIG. 2.

Now referring to FIGS. 10–12, another embodiment of the low profile socket of the present invention will be described. The socket LPS-8 is of the same construction as the socket LPS but has been modified to accept an 8-pin integrated circuit package rather than 14 pins. To this end, the central aperture CA of the socket has been eliminated due to the reduced length of the socket LPS-8. Similarly, the base member B includes only a single locking element RU coacting with a single locking aperture BLA for snap-locking the two together. The remaining elements and construction of the sockets LPS-8 are the same as described hereinabove for the 14-pin socket LPS. To enlarge the number of pins the socket can receive, the nonfunctional aperture CA may be enlarged to accommodate the increased lengths for the socket. Similarly, for the larger sizes, a plurality of such apertures may be provided with additional locking elements RU and BLA being added.

In a practical embodiment of the socket LPS, the dimensions of the socket body fall within the range of 0.396 to 1.996 inches for the lengths of sockets to accommodate the 8 to 40-pin packages; the widths vary from 0.396 inch for the 8–18-pin widths to 0.496 inch for a 22-pin socket, and 0.696 inch for 24–40 pins. The height of the integrated circuit I.C. seating plane is 0.150 inch. The feet F have a height of approximately 0.02 inch and a width of 0.03 inch. The contact C lengths vary from 0.110–0.160 inch below feet F.

What is claimed is:

1. An integrated circuit package socket comprising
    an insulative body having a plurality of spaced apart electrical contact entry apertures extending therethrough, the entry apertures being arranged adjacent opposite edges of the body for receiving an integrated circuit package with the package leads mounted in the entry apertures,
    a planar insulative base member having a plurality of spaced apart contact mounting positions defined thereon and arranged adjacent opposite edges of the base member for receiving and securing an electrical contact from an adjacent side position onto each mounting position in a non-tilting relationship, and
    a plurality of electrical contacts constructed and defined to be mounted on said base member from an adjacent side position onto preselected ones of said mounting positions on the opposite edges of the base member to receive the integrated circuit package leads inserted into the entry apertures at one end of each electrical contact in an electrical conducting relationship, each of the electrical contacts having a female receptacle at said one end for receiving the integrated circuit package leads and extending from one side of the said base member and a terminal portion dependent from the female receptacle and extending from the opposite side of said base member from the female receptacle and being spaced therefrom by a solid portion of the base member,
    the base member mounting the electrical contacts being secured to the insulative body with only the terminal portions of the contacts extending outwardly from the secured base member and the insulative body in an exposed relationship to allow an electrical conductor to be secured thereto.

2. A low profile integrated circuit socket as defined in claim 1 wherein the entry apertures are constructed and defined as a tapered entry.

3. A low profile integrated circuit socket as defined in claim 1 wherein the base member mounting positions comprise sockets constructed and defined thereon to receive and mount the electrical contacts intermediate their female receptacles and their terminal portions in a spaced apart, insulative relationship to thereby provide a positive built-in anti-wicking base.

4. A low profile integrated circuit socket as defined in claim 1 wherein each of the electrical contact female receptacles extend into the entry aperture, the female receptacle being constructed and defined as a pair of spring leaves mounted inwardly of the adjacent walls of the entry aperture and the bottom portion of the spring leaves mounted adjacent the base member to act as a fulcrum in response to the insertion of an integrated circuit package lead between the leaves as the leaves move toward the walls of the entry aperture.

5. A low profile integrated circuit socket as defined in claim 4 wherein the electrical contacts are oriented to allow the widest portion of the integrated circuit package lead to be gripped.

6. A low profile integrated circuit socket as defined in laimm 4 wherein the spring leaves are capable of moving into engagement with the adjacent walls of the entry aperture intermediate their ends in response to the insertion of a lead whereby a second fulcrum point is provided to provide increased lead gripping forces with overstressing the leaves.

7. A low profile integrated circuit socket as defined in claim 6 wherein the spring leaves are cantilevered from the terminal portion of the electrical contacts, the terminal portions being shaped adjacent the female receptacles to define a socket portion to allow the electrical contacts to be clampingly secured to the base member.

8. A low profile integrated circuit socket as defined in claim 1 wherein the insulative body is defined with an integrated circuit package removal ramp between the contact entry apertures.

9. A low profile integrated circuit socket as defined in claim 8 wherein the removal ramp includes a polarization notch.

10. An integrated circuit package as defined in claim 1 wherein said contact mounting positions of the base member comprise a plurality of areas of reduced thickness extending to the opposite edges of the base member.

11. An integrated circuit package socket comprising
an insulative body having a plurality of spaced apart electrical contact entry apertures arranged adjacent the longitudinal edges of the body and extending therethrough,
a planar insulative base member having a plurality of spaced apart contact mounting sockets defined thereon adjacent the opposite longitudinal edges thereof for clamping an electrical contact in an insulative, anti-wicking relationship therewith when the base member is secured to the insulative body, and
a plurality of electrical contacts being side loaded onto the base member and clamped to a solid section of the base member mounting sockets intermediate their ends, each contact having a pair of spaced, yieldable leaves for receiving an electrical lead therebetween with sufficient spring force generated to insure electrical current conduction, and a planar terminal member arranged in a cantilevered relationship with the leaves and extending outwardly of the base member on the opposite side thereof from said leaves,
the base member and the insulative body being secured and mounted together whereby the leaves of the contacts extend into the entry apertures in a spaced relationship with the walls thereof.

12. An integrated circuit package socket as defined in claim 11 wherein the yieldable leaves are capable of moving into engagement with the adjacent walls of the entry apertures to provide a dual spring action that allows a full range of leads of integrated circuit packages to be used without overstressing the leaves.

13. An integrated circuit package as defined in claim 11 wherein said contact mounting positions of the base member comprise a plurality of areas of reduced thickness extending to the opposite edges of the base member.

14. A low profile integrated circuit package socket comprising
an insulative body having a plurality of spaced apart electrical contact entry apertures extending therethrough and arranged adjacent opposite edges of the body for receiving the leads of an integrated circuit package mounted thereon,
an insulative member having a plurality of contact mounting positions correlated to the spaced apart entry apertures for mounting an electrical contact at each mounting position in an upright, non-tilting position, a plurality of electrical contacts with each electrical contact having a pair of spaced, resilient leaves arranged in an integral relationship with a solid, solderable post and adapted to be slipped from an adjacent position onto a contact mounting position for the insulative member and clamped thereto in said upright position,
means for securing the insulative member carrying the clamped contacts to the insulative body with the resilient leaves of the contacts extending into the corresponding entry aperture and spaced a preselected distance from the adjacent side walls of the apertures for receiving and securing a rectangular lead wire in an edge wipe relationship, the resilient leaves including an entry spring defined by the free ends of the resilient leaves and spaced apart a preselected distance to be moved apart in response to the insertion of the rectangular lead wire therebetween, the preselected distance between the ends of the leaves being proportioned to cause sufficient forces to assure a good electrical pressure contact between the leaves and the lead wire, the preselected spacing between the resilient leaves and the adjacent side walls is proportioned relative to the total outward deflection required of the leaves to allow the leaves to move into engagement with the adjacent side walls for defining leaf fulcrums at the points of contact to allow increased deflection of the leaves without overstressing of the leaves to thereby allow the leaves to return to their original shape upon removal of the lead wire.

15. A low profile integrated circuit package socket as defined in claim 14 wherein the insulative body includes a plurality of integral mounting feet for mounting the socket constructed and defined to allow sufficient clearance with the socket mounting surface to allow ease of solder flux removal and a stable assembly.

16. A low profile integrated circuit package socket as defined in claim 14 wherein the insulative body includes an integrated circuit package removal ramp constructed and defined intermediate the entry apertures.

17. A low profile integrated circuit package socket as defined in claim 16 wherein a removal ramp is provided adjacent each end of the insulative body with one ramp including a machine oriented polarization notch defined thereon.

18. A low profile integrated circuit package socket as defined in claim 17 wherein the securing means comprises means for snap-locking the insulative body and member together.

19. A low profile integrated circuit package socket as defined in claim 18 wherein the insulative member includes a male member and the insulative body includes a female member adapted to be mounted together in a snap-locked relationship.

20. A low profile integrated circuit package socket as defined in claim 15 wherein the integral mounting feet are arranged adjacent each corner of the insulative body and extend outwardly of the insulative member, the entry apertures including entry ramps terminating adjacent the free ends of the contact leaves.

21. A low profile integrated circuit package socket as defined in claim 14 wherein each electrical contact has its solderable post arranged in an offset relationship with the resilient leaves and constructed integrally with a portion extending from one end of the bottom section of the leaves and bent into a substantial L-section to connect with the post for defining a substantial U-shaped mounting socket for clamping to a contact mounting position on the insulative member.

22. An integrated circuit package as defined in claim 14 wherein said contact mounting positions of the base member comprise a plurality of areas of reduced thickness extending to the opposite edges of the base member.

* * * * *